US012813185B2

(12) United States Patent
Kumakura et al.

(10) Patent No.: US 12,813,185 B2
(45) Date of Patent: Nov. 24, 2026

(54) SUBSTRATE PROCESSING METHOD AND SUBSTRATE PROCESSING APPARATUS

(71) Applicant: Tokyo Electron Limited, Tokyo (JP)

(72) Inventors: Sho Kumakura, Kurokawa-gun (JP); Kenta Ono, Kurokawa-gun (JP); Shinya Ishikawa, Kurokawa-gun (JP)

(73) Assignee: Tokyo Electron Limited, Tokyo (JP)

( * ) Notice: Subject to any disclaimer, the term of this patent is extended or adjusted under 35 U.S.C. 154(b) by 114 days.

(21) Appl. No.: 18/485,978

(22) Filed: Oct. 12, 2023

(65) Prior Publication Data

US 2024/0047223 A1 Feb. 8, 2024

Related U.S. Application Data

(63) Continuation of application No. PCT/JP2022/010487, filed on Mar. 10, 2022.

(30) Foreign Application Priority Data

Apr. 14, 2021 (JP) ................................ 2021-068523

(51) Int. Cl.
*H10P 50/00* (2026.01)
*H01J 37/32* (2006.01)

(52) U.S. Cl.
CPC ........ *H10P 50/73* (2026.01); *H01J 37/32449* (2013.01); *H10P 50/691* (2026.01); *H10P 50/71* (2026.01); *H01J 2237/332* (2013.01)

(58) Field of Classification Search
None
See application file for complete search history.

(56) References Cited

U.S. PATENT DOCUMENTS

2003/0146485 A1 8/2003 Ezaki
2005/0208434 A1* 9/2005 Mosden .................... G03F 7/11 257/E21.255
2006/0030151 A1 2/2006 Ding et al.
2013/0288482 A1 10/2013 Nam et al.
2017/0146909 A1* 5/2017 Smith .................. G03F 7/0042
2018/0226279 A1* 8/2018 Ogawa ............. H01L 21/31138
2018/0233350 A1* 8/2018 Tois .................... H01L 23/3171
2018/0239244 A1* 8/2018 Raley ............... H01L 21/31144
2019/0237341 A1 8/2019 Yu et al.
2020/0273705 A1 8/2020 Singh et al.

FOREIGN PATENT DOCUMENTS

CN 108028196 A 5/2018
CN 110520963 A 11/2019
CN 111989766 A 11/2020
JP 2007-529899 A 10/2007
(Continued)

*Primary Examiner* — Stephanie P Duclair
(74) *Attorney, Agent, or Firm* — PROCOPIO, CORY, HARGREAVES & SAVITCH LLP

(57) ABSTRACT

A substrate processing method according to the present disclosure includes: providing a substrate in a chamber, the substrate having an etching target film and a tin-containing film, the tin-containing film defining at least one opening on the etching target film; and forming a modified film by supplying a processing gas to the chamber to form the modified film on a surface of the tin-containing film, the processing gas including a halogen-containing gas or an oxygen-containing gas.

11 Claims, 9 Drawing Sheets

(56) References Cited

FOREIGN PATENT DOCUMENTS

| | | | |
|---|---|---|---|
| JP | 2017-045869 | A | 3/2017 |
| JP | 2018-006742 | A | 1/2018 |
| JP | 2020-019178 | A | 2/2020 |
| JP | 2021-019178 | A | 2/2021 |
| KR | 2019-0112157 | A | 10/2019 |
| KR | 10-2020-0033941 | A | 3/2020 |
| TW | 200534380 | A | 10/2005 |
| TW | 201719748 | A | 6/2017 |
| WO | 2019/036582 | A1 | 2/2019 |

* cited by examiner

Fig. 12

| | Before modified | After modified | |
|---|---|---|---|
| | | Example 1 ($Cl_2$/Ar) | Example 2 (HBr/Ar) |
| Film thickness[nm] | 14.8 | 13.8 | 12.7 |
| Line CD/Space CD[nm] | 17.9/18.3 | 20.2/15.9 | 15.6/20.5 |
| LWR/LER[nm] | 4.1/2.6 | 3.3/2.4 | 3.9/2.5 |

SUBSTRATE PROCESSING METHOD AND SUBSTRATE PROCESSING APPARATUS

CROSS-REFERENCE TO RELATED APPLICATION

The present application claims priority under 35 U.S.C. § 119 to Japanese Patent Application No. 2021-068523 filed on Apr. 14, 2021 and is a continuation of PCT Application No. PCT/JP2022/10487 filed on February Mar. 10, 2022, the entire contents of which are incorporated herein by reference.

BACKGROUND

Field

Exemplary embodiments of the present disclosure relate to a substrate processing method and a substrate processing apparatus.

Description of Related Art

JP 2018-6742 A relates to a pattern formation method for semiconductor devices, and discloses a technique of using a thin tin oxide film as an etching mask.

SUMMARY

The present disclosure provides a technique of modifying a tin-containing films on a substrate. One exemplary embodiment of the present disclosure provides a substrate processing method. The substrate processing method includes: providing a substrate in a chamber, the substrate having an etching target film and a tin-containing film, the tin-containing film defining at least one opening on the etching target film, and forming a modified film by supplying a processing gas to the chamber to form the modified film on a surface of the tin-containing film, the processing gas including a halogen-containing gas or an oxygen-containing gas.

BRIEF DESCRIPTION OF DRAWINGS

FIG. 12 illustrates the results of the modification process of Examples.

DETAILED DESCRIPTION

Figure 1:
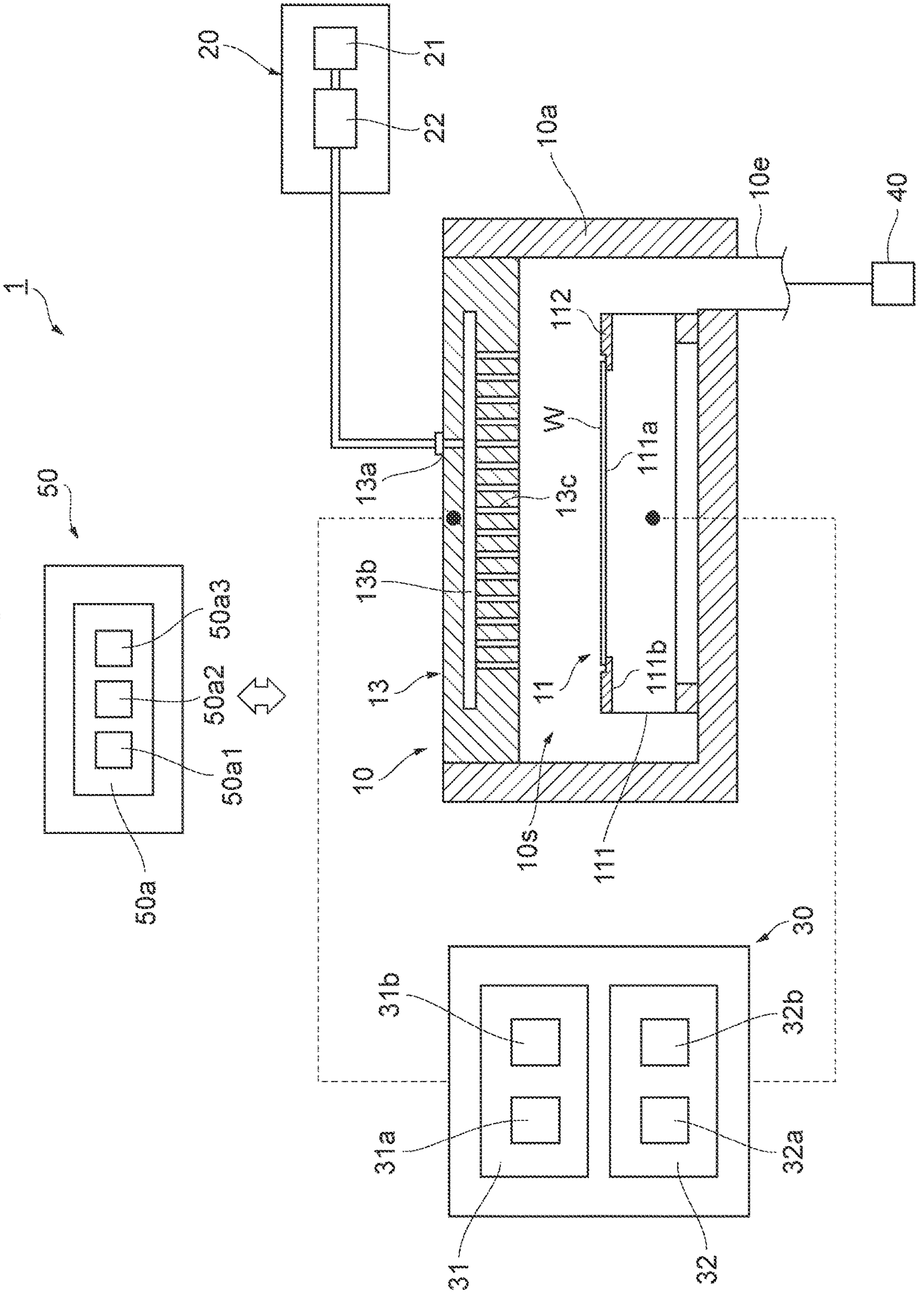
FIG. 1 schematically illustrates a substrate processing apparatus 1.

The following describes embodiments of the present disclosure.

One exemplary embodiment provides a substrate processing method. The substrate processing method includes: providing a substrate in a chamber, the substrate having an etching target film and a tin-containing film, the tin-containing film defining at least one opening on the etching target film, and forming a modified film by supplying a processing gas to the chamber to form the modified film on a surface of the tin-containing film, the processing gas including a halogen-containing gas or an oxygen-containing gas.

In one exemplary embodiment, forming the modified film may include: forming a plasma from the processing gas; and forming the modified film on the tin-containing film by the plasma.

In one exemplary embodiment, forming the modified film may include reacting the processing gas and a surface of the tin-containing film to form the modified film.

In one exemplary embodiment, the modified film may include a tin-halogen bond.

One exemplary embodiment may further include, after forming the modified film, forming a deposited film on the tin-containing film.

In one exemplary embodiment, the deposited film may be formed by at least one of plasma CVD and ALD.

In one exemplary embodiment, the deposited film may be selectively formed on a top surface of the tin-containing film.

In one exemplary embodiment, the deposited film may be formed by sputtering an upper electrode disposed above the substrate.

In one exemplary embodiment, the sputtering may include: forming a plasma between the substrate and the upper electrode; and making the upper electrode have a negative potential.

In one exemplary embodiment, forming the deposited film and forming the modified film may be performed in the same chamber.

One exemplary embodiment may further include etching the etching target film during or after formation of the modified film.

In one exemplary embodiment, etching the etching target film and forming the deposited film may be performed in the same chamber.

In one exemplary embodiment, the tin-containing film may include photoresist.

The following describes embodiments of the present disclosure in details with reference to the drawings. Like reference numerals designate like elements in the drawings to omit their duplicated descriptions. Unless otherwise specified, positional relationships such as top, bottom, left, and right will be described based on the positional relationships illustrated in the drawings. The accompanying drawings have not necessarily been drawn to scale, and the actual proportions are not limited to the illustrated ones.

<Configuration of Substrate Processing Apparatus 1>

FIG. 1 schematically illustrates a substrate processing apparatus 1 according to one exemplary embodiment. A substrate processing method according to one exemplary embodiment (hereinafter referred to as "the present processing method") may be performed using the substrate processing apparatus 1.

The substrate processing apparatus 1 is a capacitively coupled plasma processing apparatus. The substrate processing apparatus 1 includes a plasma processing chamber 10, a gas supply 20, a power supply 30, an exhaust system 40, and a controller 50. The substrate processing apparatus 1 also includes a substrate support 11, and a gas inlet. The gas inlet is configured to introduce at least one processing gas into the plasma processing chamber 10. The gas inlet includes a showerhead 13. The substrate support 11 is disposed in the plasma processing chamber 10. The showerhead 13 is disposed above the substrate support 11. In one exemplary embodiment, the showerhead 13 constitutes at least part of the ceiling of the plasma processing chamber 10. The plasma processing chamber 10 has a plasma processing space 10*s* defined by the showerhead 13, sidewalls 10*a* of the plasma processing chamber 10 and the substrate support 11. The plasma processing chamber 10 has at least one gas supply port for supplying at least one processing gas to the plasma processing space 10*s* and at least one gas exhaust port for exhausting gas from the plasma processing space. The sidewalls 10*a* are grounded. The showerhead 13 and substrate support 11 are electrically insulated from the housing of the plasma processing chamber 10.

The substrate support 11 includes a body 111 and a ring assembly 112. The body 111 has a central region (substrate support face) 111*a* for supporting a substrate (wafer) W and an annular region (ring support face) 111*b* for supporting the ring assembly 112. The annular region 111*b* of the body 111 surrounds the central region 111*a* of the body 111 in plan view. The substrate W is disposed on the central region 111*a* of the body 111, and the ring assembly 112 is disposed on the annular region 111*b* of the body 111 so as to surround the substrate W on the central region 111*a* of the body 111. In one exemplary embodiment, the body 111 includes a base and an electrostatic chuck. The base includes an electrically conductive member. The electrically conductive member of the base functions as a lower electrode. The electrostatic chuck is disposed on the base. The top face of the electrostatic chuck has the substrate support face 111*a*. The ring assembly 112 includes one or more annular members. At least one of the one or more annular members is an edge ring. Although not illustrated, the substrate support 11 may include a temperature-controlled module configured to control at least one of the electrostatic chuck, the ring assembly 112, and the substrate to a target temperature. The temperature-controlled module may include a heater, a heat transfer medium, a channel, or a combination of them. A heat transfer fluid, such as brine or gas, flows through the channel. The substrate support 11 may include a heat-transfer gas supply configured to supply a heat transfer gas to between the rear face of the substrate W and the substrate support face 111*a*.

The showerhead 13 is configured to introduce at least one processing gas from the gas supply 20 into the plasma processing space 10*s*. The showerhead 13 has at least one gas supply port 13*a*, at least one gas diffuser 13*b*, and a plurality of gas inlets 13*c*. The processing gas supplied to the gas supply port 13*a* passes through the gas diffuser 13*b* and is introduced into the plasma processing space 10*s* from the plurality of gas inlets 13*c*. The showerhead 13 includes an electrically conductive member. The electrically conductive member of the showerhead 13 functions as an upper electrode. In addition to the showerhead 13, the gas inlet may include one or more side gas injectors (SGIs) attached to one or more openings formed in the sidewalls 10*a*.

The gas supply 20 may include at least one gas source 21 and at least one flow rate controller 22. In one exemplary embodiment, the gas supply 20 is configured to supply at least one processing gas from a corresponding gas source 21 to the showerhead 13 via a corresponding flow rate controller 22. For instance, each flow rate controller 22 may include a mass flow controller or a pressure-controlled flow rate controller. The gas supply 20 also may include one or more flow rate modulation devices that modulate or pulse the flow rate of the at least one processing gas.

The power supply 30 includes an RF power supply 31 that is coupled to the plasma processing chamber 10 via at least one impedance matching circuit. The RF power supply 31 is configured to supply at least one RF signal (RF power), such as a source RF signal and a bias RF signal, to the electrically conductive member of the substrate support 11 and/or the electrically conductive member of the showerhead 13. This forms a plasma from the at least one processing gas supplied to the plasma processing space 10*s*. Thus, the RF power supply 31 can function as at least part of a plasma generator that is configured to form a plasma from one or more processing gases in the plasma processing chamber 10. A bias RF signal, which is supplied to the electrically conductive member of the substrate support 11, generates a bias potential in the substrate W, so that ion components in the formed plasma can be drawn toward the substrate W.

In one exemplary embodiment, the RF power supply 31 includes a first RF generator 31*a* and a second RF generator 31*b*. The first RF generator 31*a* is coupled to the electrically conductive member of the substrate support 11 and/or the electrically conductive member of the showerhead 13 via at least one impedance matching circuit and is configured to generate a source RF signal (source RF power) for plasma generation. In one exemplary embodiment, the source RF signal has a frequency in the range of 13 MHz to 150 MHz. In one exemplary embodiment, the first RF generator 31*a* may be configured to generate a plurality of source RF signals each having a different frequency. The generated one or more source RF signals are supplied to the electrically conductive member of the substrate support 11 and/or the electrically conductive member of the showerhead 13. The second RF generator 31*b* is coupled to the electrically conductive member of the substrate support 11 via at least one impedance matching circuit and is configured to generate a bias RF signal (bias RF power). In one exemplary embodiment, the bias RF signal has a frequency lower than the frequency of the source RF signal. In one exemplary embodiment, the bias RF signal has a frequency in the range of 400 kHz to 13.56 MHz. In one exemplary embodiment, the second RF generator 31*b* may be configured to generate a plurality of bias RF signals each having a different frequency. The generated one or more bias RF signals are supplied to the electrically conductive member of the substrate support 11. In various embodiments, at least one of the source RF signal and bias RF signal may be pulsed.

The power supply 30 may also include a DC power supply 32 that is coupled to the plasma processing chamber 10. The DC power supply 32 includes a first DC generator 32*a* and a second DC generator 32*b*. In one exemplary embodiment, the first DC generator 32*a* is connected to the electrically conductive member of the substrate support 11 and is configured to generate a first DC signal. The generated first bias DC signal is applied to the electrically conductive member of the substrate support 11. In one exemplary embodiment, the first DC signal may be applied to other electrodes, such as an electrode in the electrostatic chuck. In one exemplary embodiment, the second DC generator **32*b* is connected to the electrically conductive member of the showerhead 13 and is configured to generate a second DC signal. The generated second DC signal is applied to the electrically conductive member of the showerhead 13. In various embodiments, at least one of the first and second DC signals may be pulsed. The first and second DC generators 32*a* and 32*b* may be provided in addition to the RF power supply 31, and the first DC generator 32*a* may be provided instead of the second RF generator 31*b***.

For instance, the exhaust system 40 can be connected to a gas exhaust port **10*e* provided at the bottom of the plasma processing chamber 10. The exhaust system 40 may include a pressure regulation valve and a vacuum pump. The pressure regulation valve regulates the pressure in the plasma processing space 10*s***. The vacuum pump may include a turbomolecular pump, a dry pump, or a combination of these.

The controller 50 processes computer-executable instructions that cause the substrate processing apparatus 1 to perform various steps described in this disclosure. The controller 50 can be configured to control each element of the substrate processing apparatus 1 to perform various steps described herein. In one exemplary embodiment, part or all of the controller 50 may be provided as part of a configuration of an apparatus external to the substrate processing apparatus 1. For instance, the controller 50 may include a computer **50*a*. The computer 50*a* may include a processor (central processing unit: CPU) 50*a*1, a storage 50*a*2, and a communication interface 50*a*3. The processor 50*a*1 can be configured to execute various control operations based on a program stored in the storage 50*a*2. The storage 50*a*2 may include random access memory (RAM), read only memory (ROM), hard disk drive (HDD), solid state drive (SSD), or a combination of them. The communication interface 50*a*3 may communicate with other components of the substrate processing apparatus 1** via a communication line such as a local area network (LAN).

<Configuration of Substrate Processing System PS>

Figure 2:
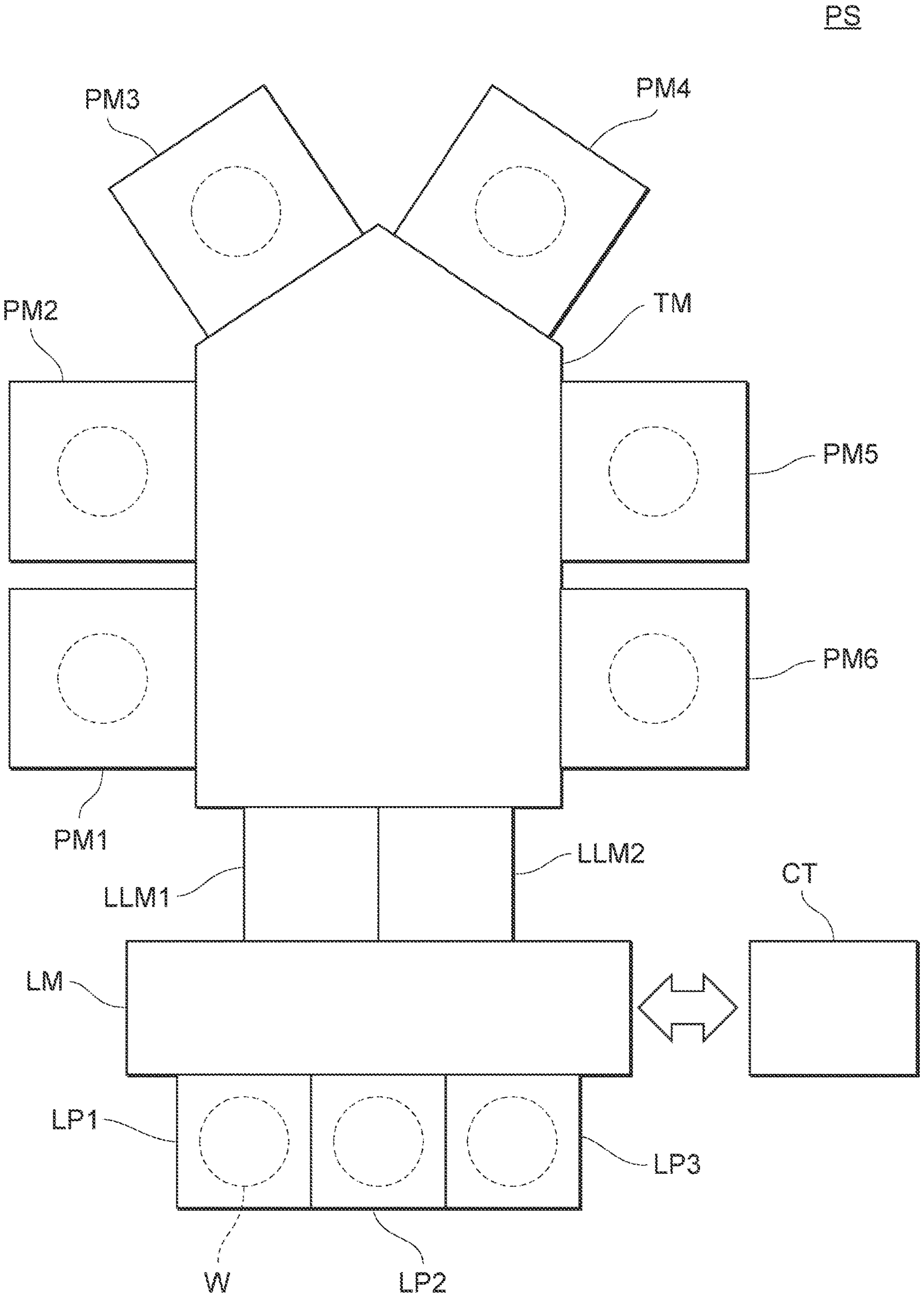
FIG. 2 schematically illustrates a substrate processing system PS.

FIG. 2 schematically illustrates the substrate processing system PS according to one exemplary embodiment. The present processing method may be performed using the substrate processing system PS.

The substrate processing system PS includes substrate processing chambers PM1 to PM6 (hereinafter also collectively referred to as "substrate processing module PM"), a transfer module TM, load-lock modules LLM1 and LLM2 (hereinafter also collectively referred to as "load-lock module LLM"), a loader module LM, and load ports LP1 through LP3 (hereinafter also collectively referred to as "load port LP"). The controller CT controls each element of the substrate processing system PS to perform predetermined processing on a substrate W.

The substrate processing module PM performs different types of processing such as etching processing, trimming processing, film-forming processing, annealing processing, doping processing, lithography processing, cleaning processing, and ashing processing on a substrate W within the module. Some of the substrate processing modules PM may be a measurement module, which may measure the thickness of films formed on a substrate W or the dimensions of patterns formed on a substrate W, for example. The substrate processing apparatus 1 illustrated in FIG. 1 is an example of the substrate processing module PM.

The transfer module TM has a conveyer that transfers a substrate W, and transfers a substrate W between the substrate processing modules PM or between one of the substrate processing module PM and one of the load lock module LLM. The substrate processing modules PM and the load lock modules LLM are disposed adjacent to the transfer module TM. The transfer module TM are spatially isolated from or connected with the substrate processing modules PM or the load lock modules LLM by openable/closable gate valves.

The load-lock modules LLM1 and LLM2 are provided between the transfer module TM and the loader module LM. The load-lock module LLM can change its internal pressure between atmospheric pressure and vacuum. The load-lock module LLM transfers a substrate W from the loader module LM at atmospheric pressure to the transfer module TM in vacuum, or transfers a substrate W from the transfer module TM in vacuum to the loader module LM at atmospheric pressure.

The loader module LM has a conveyer that transfers a substrate W to transfer the substrate W between the load-lock module LLM and the load port LP. A front opening unified pod (FOUP) that can store 25 substrates W, for example, or an empty FOUP can be placed inside the load port LP. The loader module LM takes out a substrate W from the FOUP in the load port LP and transfers it to the load-lock module LLM. The loader module LM also takes out a substrate W from the load-lock module LLM and transfers it to the FOUP in the load port LP.

The controller CT controls each element of the substrate processing system PS to perform predetermined processing on a substrate W. The controller CT stores recipes in which process procedures, process conditions, transfer conditions, etc. are set, and controls each element of the substrate processing system PS to perform predetermined processing on a substrate W in accordance with the recipes. The controller CT may also function as part or all of the controller 50 of the substrate processing apparatus 1 illustrated in FIG. 1.

Example of the Present Processing Method

Figure 3:
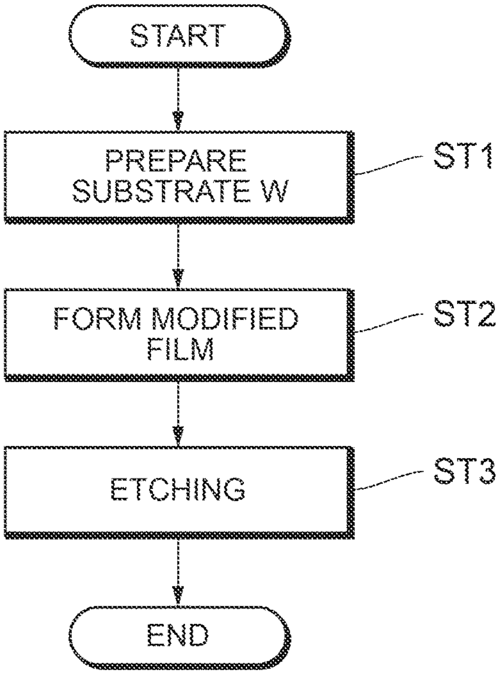
FIG. 3 is a flowchart illustrating the present processing method.

FIG. 3 is a flowchart of the present processing method. As illustrated in FIG. 3, the present processing method includes: a step of preparing a substrate W (step ST1); a step of forming a modified film (step ST2); and a step of performing etching (step ST3).

Referring to FIGS. 4A to 4C, FIG. 5, and FIG. 6, the following describes an example of the present processing method illustrated in FIG. 3. The following describes the process by way of an example where the controller 50 controls each element of the substrate processing apparatus 1 (see FIG. 1) to execute the present processing method.

(Preparation of Substrate W: Step ST1)

Figure 4A:
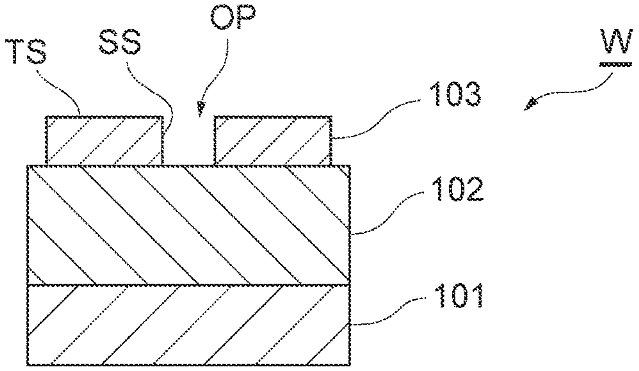
FIG. 4A illustrates an example of the cross-sectional structure of the substrate W prepared in step ST1.

FIG. 4A illustrates an example of the cross-sectional structure of the substrate W prepared in step ST1. In ST1, a substrate W is prepared in the plasma processing space **10*s* of the plasma processing chamber 10. In the plasma processing space 10*s*, the substrate W is placed on the substrate support face 111*a* of the substrate support 11 and held by the electrostatic chuck. At least part of the process of forming each structure of the substrate W may be performed in the plasma processing space 10*s*. After all or part of the structure of the substrate W is formed in an apparatus or chamber outside the substrate processing apparatus 1, the substrate W may be disposed in the plasma processing space 10*s***.

For instance, the substrate W prepared in step ST1 is formed to include an underlying film 101, a film to be etched (this may be called an etching target film) 102, and a tin-containing film 103 that are stacked in this order.

Examples of the underlying film 101 include a silicon wafer or an organic film, dielectric film, metal film, or semiconductor film formed on a silicon wafer. The underlying film 101 may include a stack of films.

For instance, the etching target film 102 may be an organic film, a dielectric film, a semiconductor film or a metal film. The etching target film 102 may include a single film or a stack of films.

For instance, the tin-containing film 103 includes tin oxide and/or tin hydroxide. For instance, the tin-containing film 103 may include an organic substance, which may be a photoresist.

Each film (underlying film 101, etching target film 102, and tin-containing film 103) constituting the substrate W may be formed by methods such as CVD, ALD, and spin coating. Each of these films may be a flat film, or may be a film having unevenness.

The tin-containing film 103 has a top surface TS and side surfaces SS extending in a different direction (e.g., perpendicular direction) from the top surface TS. The tin-containing film 103 has an opening pattern. The opening pattern defines at least one opening OP on the etching target film 102. The opening OP is a space on the etching target film 102 and is surrounded by side surfaces SS of the tin-containing film 103. The etching target film 102 has an area covered by the tin-containing film 103 and an area exposed at the bottom of the opening OP.

The opening pattern of the tin-containing film 103 may have any shape in plan view of the substrate W (when the substrate W is viewed from top to bottom in FIG. 4A). For instance, the opening pattern may be a line-and-space (L/S) pattern in which a plurality of linear openings OP are arranged at regular intervals in plan view, or may be an array pattern in which a plurality of a hole-shaped openings OP such as a circle, ellipse, or rectangle are arranged in plan view.

For instance, the opening pattern of the tin-containing film 103 may be formed by lithography. Specifically, this starts with the formation of a photoresist film containing tin on the etching target film 102. Then, the photoresist film is selectively irradiated with light (e.g., EUV excimer laser) through an exposure mask having an opening pattern to expose the photoresist film with the light of the opening pattern. Then, the exposed photoresist film is developed. This may form the tin-containing film 103 having the opening pattern. When the opening pattern is a line and space (L/S) pattern, this may be a half pitch of 18 nm, for example. For instance, the opening pattern of the tin-containing film 103 may be formed by etching.

Figure 5:
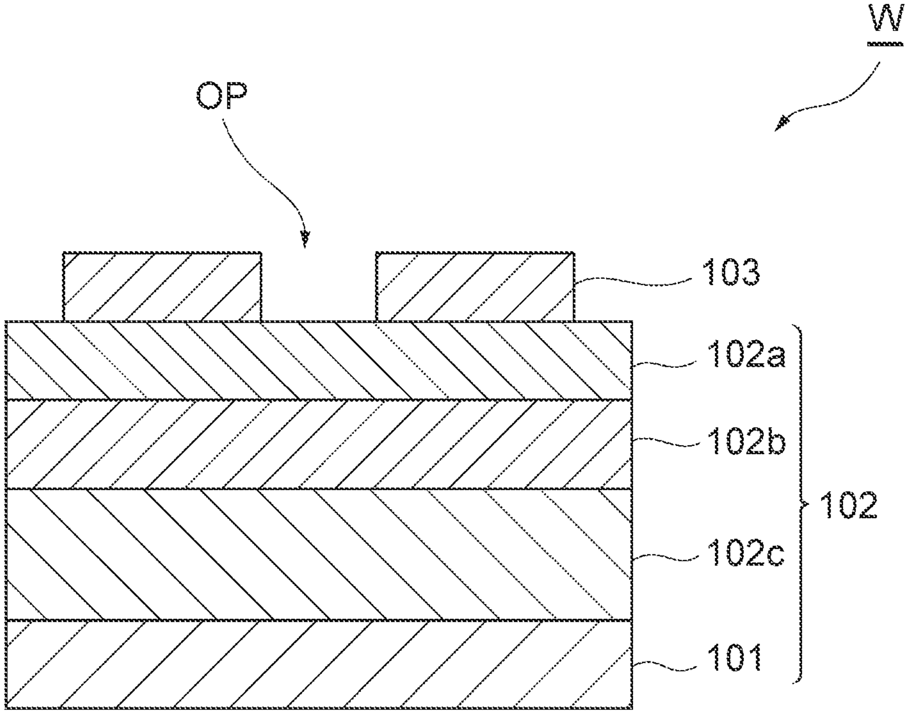
FIG. 5 illustrates another example of the cross-sectional structure of the substrate W.

Note that the substrate W prepared in step ST1 can take various forms. FIG. 5 illustrates another example of the cross-sectional structure of the substrate W. As illustrated in FIG. 5, the etching target film 102 may be configured by stacking films, and may include a first film 102*a*, a second film 102*b*, and a third film 102*c*. The etching properties of these first film 102*a*, second film 102*b*, and third film 102*c* may differ from each other. The tin-containing film 103, the first film 102*a*, and the second film 102*b* can constitute a three-layered multilayer mask for the third film 102*c*. In this case, the opening pattern of the tin-containing film 103 is sequentially transferred to the first film 102*a*, second film 102*b*, and third film 102*c* by etching.

For instance, the first film 102*a* is a spin-on-glass (SOG) film, a SiON film, or a Si-containing antireflection film (SiARC). The first film 102*a* may include a stack of films, for example, which may be a stack of a bottom anti-reflective coating (BARC) on a SiON film.

The second film 102*b* may be a carbon-containing film such as a spin-on carbon (SOC) film or amorphous carbon layer (ACL).

The third film 102*c* may be a silicon-containing dielectric film such as SiC, SiON, SiN and/or $SiO_2$. The third film 102*c* may include a stack of films, for example, a stack of silicon oxide films or silicon nitride films.

Figure 6:
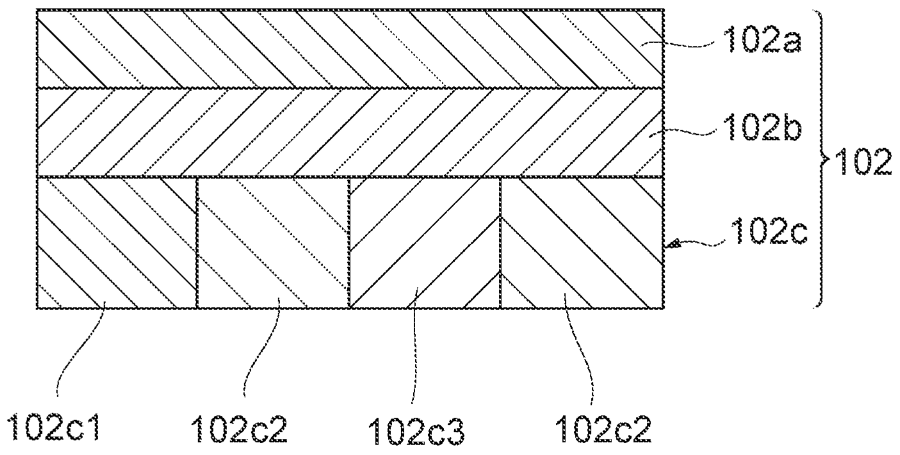
FIG. 6 illustrates another example of the third film 102*c* in FIG. 5.

FIG. 6 illustrates another example of the third film 102*c* in FIG. 5. As illustrated in FIG. 6, the third film 102*c* may include a plurality of films (SiN film 102*c*1, SiO film 102*c*2, and SiC film 102*c*3) that are arranged in a predetermined order in a direction perpendicular to the stacking direction (horizontal direction in FIG. 6). Any of the SiN film 102*c*1, SiO film 102*c*2, and SiC film 102*c*3 may be selectively etched.

(Formation of Modified Film: Step ST2)

Figure 4B:
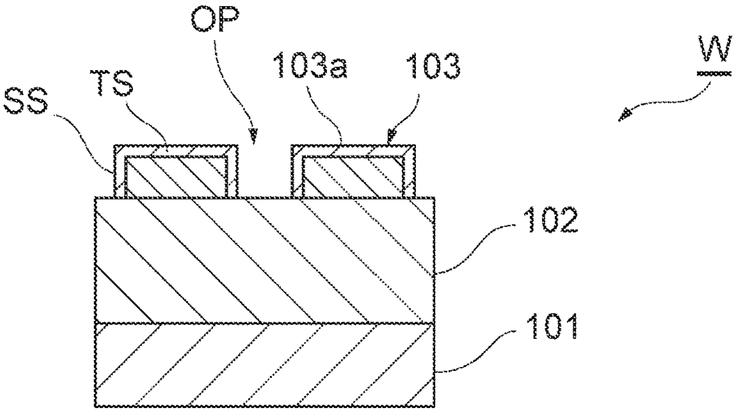
FIG. 4B illustrates an example of the cross-sectional structure of the substrate W in step ST2.

FIG. 4B illustrates an example of the cross-sectional structure of the substrate W in step ST2. As illustrated in FIG. 4B, in step ST2, a modified film 103*a* is formed on the tin-containing film 103 (hereinafter, this process is also referred to as "modification process"). Specifically, this step starts with supplying of processing gas containing halogen-containing gas or oxygen-containing gas from the gas supply 20 into the plasma processing space 10*s*.

For instance, the halogen-containing gas may include one or more gases consisting of molecules containing F, Cl, Br, and I, such as $CHF_3$, $CF_4$, $NF_3$, $SF_6$, $IF_7$, HF, HBr, $Cl_2$, $BCl_3$, $Br_2$, $SiF_4$ and/or $SiCl_4$. For the halogen-containing gas, gases consisting of molecules not containing H (hydrogen) (in the above examples, $CF_4$, $NF_3$, $SF_6$, $IF_7$, $Cl_2$, $BCl_3$, $Br_2$, $SiF_4$ and/or $SiCl_4$) may be used. For instance, the oxygen-containing gas may include one or more gases consisting of molecules containing O, such as CO, $O_2$, $CO_2$, $O_3$, NO, $NO_2$, $SO_2$ and/or COS. The processing gas may also include noble gases such as Ar, and inert gases such as $N_2$.

Next, RF signals are supplied from the RF power supply 31 to the plasma processing space 10*s* to form a plasma of the processing gas in the plasma processing space 10*s*. Ions and radicals in the formed plasma chemically bond with tin on the surface (top surface TS and side surfaces SS) and near the surface (hereinafter they are collectively referred to as "surface") of the tin-containing film 103, so that a modified film 103*a* is formed on the surface of the tin-containing film 103.

Plasma does not necessarily have to be used for the modification process. Specifically, processing gas containing a halogen-containing gas or an oxygen-containing gas is supplied from the gas supply 20 into the plasma processing space 10*s*, so as to let this processing gas directly react with the surface of the tin-containing film 103 to form the modified film 103*a*. The processing gas may contain highly reactive gases such as HF, IF, and $O_3$ gases, which have high reactivity before they turn into plasma (also in the state of raw gas). Thermal energy, electromagnetic wave energy, optical energy, and other energies may be applied to the processing gas to promote the reactivity of the processing gas.

When the processing gas includes a halogen-containing gas, the modified film 103*a* contains tin halide (tin-halogen bond). When the processing gas includes an oxygen-containing gas, the modified film 103*a* has the oxidation of tin that is promoted compared to other parts of the tin-containing film 103, and thus includes more tin oxide (or tin-oxygen bond). The bond energies of the tin-halogen and tin-oxygen bonds are higher than those of the tin-tin bonds. Thus, tin halides and tin oxides, which have more tin-halogen bonds and tin-oxygen bonds, have higher melting and boiling points than those of tin halides and tin oxides, which have fewer tin-halogen bonds and tin-oxygen bonds, and they are thermally stable. This means that the modified film 103*a* becomes more thermally or chemically stable than other parts of the tin-containing film 103, and has improved chemical resistance such as plasma resistance. For instance, the tin-containing film 103 with the modified film 103*a* formed thereon can have better etching or corrosion resistance (etching rate can be lower) to the etching gas that etches the etching target film 102 than the tin-containing film 103 with no modified film 103*a* formed. For instance, the modified film 103*a* has a thickness of 1 to 2 nm. The modified film 103*a* may be formed on the whole or on part of the surface of the tin-containing film 103.

The modification process can also harden the modified film 103*a* and/or reduce the impurity content of the modified film 103*a* compared to other parts of the tin-containing film 103. This can improve the chemical resistance of the tin-containing film 103. The modification process can also make the dimensions/shape of the opening pattern of the tin-containing film 103 more uniform than before the modification process. For instance, when the opening pattern is a line-and-space (L/S) pattern, the line edge roughness (LER) and line width roughness (LWR) can improve.

(Etching: Step ST3)

Figure 4C:
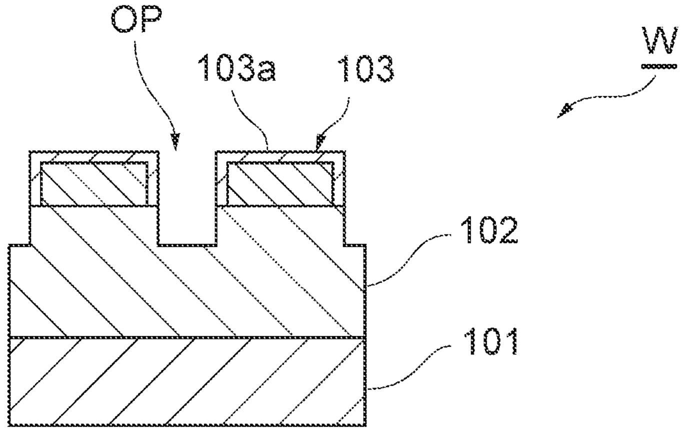
FIG. 4C illustrates an example of the cross-sectional structure of the substrate W in step ST3.

FIG. 4C illustrates an example of the cross-sectional structure of the substrate W in step ST3. As illustrated in FIG. 4C, in step ST3, the etching target film 102 is etched. Specifically, for instance, processing gas is supplied from the gas supply 20 into the plasma processing space 10*s*, and an RF signal is supplied from the RF power supply 31 to the substrate support 11. This forms a plasma in the plasma processing space 10*s*, and ion components in the plasma are drawn into the substrate W. At this time, the tin-containing film 103 including the modified film 103*a* functions as a mask, and the part of the etching target film 102 that is exposed at the bottom of the opening OP is etched in the depth direction of the opening OP (top to bottom direction in FIG. 4C).

The tin-containing film 103 with the modified film 103*a* formed thereon can have better etching resistance to the etching gas (processing gas) for the etching target film 102. This means that, when the tin-containing film 103 is used as a mask to etch the etching target film 102, deformation of the tin-containing film 103, reduction in film thickness, and scattering of tin or other elements from the tin-containing film 103 onto the etching film 102 are suppressed. This enables more appropriate etching of the etching target film 102.

When the etching target film 102 has a stacked structure as illustrated in FIG. 5, the processing gas may be selected depending on the material of each film, and the films may be etched one after another. For instance, when the first film 102*a* is a spin-on-glass (SOG) film, a SiON film, a Si-containing antireflection film (SiARC), the processing gas for etching may be CF-based gases ($CF_4$, $C_4F_6$, $C_4F_8$, $CHF_3$, $CH_2F_2$ gas, and others). The tin-containing film 103 with the modified film 103*a* formed thereon can have better etching resistance to the CF-based gas that etches the etching target film 102.

When at least one of the layers constituting the etching target film 102 (e.g., the second film 102*b*) is a carbon-containing film such as a spin-on carbon (SOC) film or an amorphous carbon layer (ACL), the processing gas for etching may be a hydrogen-containing gas (e.g., $N_2/H_2$ gas) or an oxygen-containing gas (e.g., $O_2$/COS gas, $CO_2$/COS gas). When an oxygen-containing gas is used for etching the second film 102*b*, the tin-containing film 103 may be removed before etching the second film 102*b*. This prevents scattering of tin or other elements from the tin-containing film 103 during etching of the second film 102*b*, which requires high bias power. When a hydrogen-containing gas is used for etching the second film 102*b*, the tin-containing film 103 and second film 102*b* may be removed at the same time.

When the third film 102*c* is a silicon-containing dielectric film such as SiC, SiON, SiN and/or $SiO_2$, the processing gas for etching may be a CF-based gas (e.g., $CF_4$, $C_4F_6$, $C_4F_8$, $CHF_3$, and $CH_2F_2$ gas). The tin-containing film 103 may be removed before etching the third film 102*c*. This prevents scattering of tin or other elements from the tin-containing film 103 during etching of the third film 102*c*, which requires high bias power.

Modified Examples of the Present Processing Method

Figure 7:
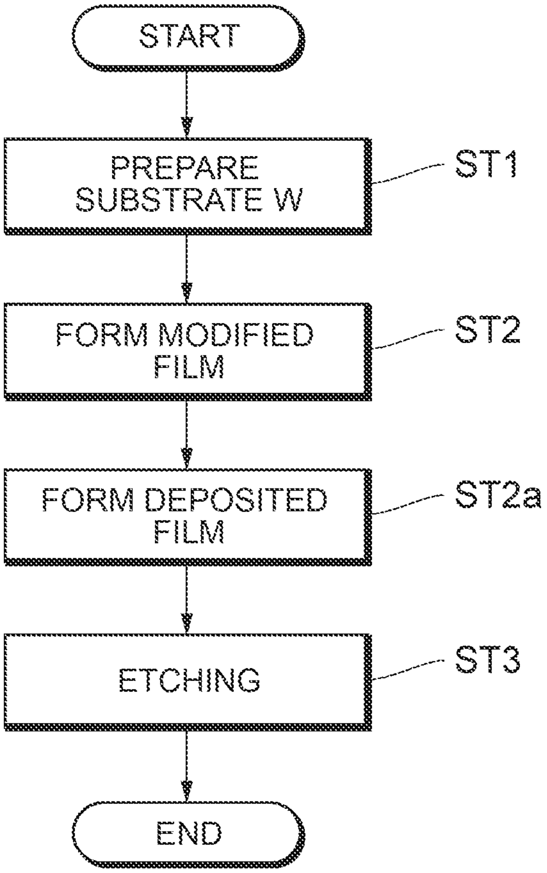
FIG. 7 is a flowchart illustrating a modified example of the present processing method.

FIG. 7 is a flowchart of a modified example of the present processing method. This modified example illustrated in FIG. 7 is similar to the example in FIG. 3, except that after step ST2, it has a further process of forming a deposited film (step ST2*a*). Various modifications may be made to this processing method without departing from the scope and spirit of this disclosure.

As illustrated in FIG. 7, step ST2*a* is executed between step ST2 and step ST3. In step ST2*a*, a deposited film is formed on the tin-containing film 103 with the modified film 103*a* formed thereon. The deposited film may be formed by plasma CVD. The processing gas in plasma CVD may contain carbon (C) such as $CH_4$. In this case, the deposited film is formed containing carbon. The deposited film may be selectively formed on the top surface TS among the top surface TS and side surface SS of the tin-containing film 103 and the exposed surface ES of the etching target film 102. That is, the deposited film is formed so that the deposition rate is faster on the top surface TS than on the side surfaces SS and the exposed surface ES.

For instance, the deposited film may be formed by the following method. First, a first gas (e.g., silicon (Si)-containing gas) is supplied to the substrate W, and molecules of the first gas are adsorbed on at least the tin-containing film 103 to form a precursor layer. Next, a second gas (e.g., oxygen gas ($O_2$)) is supplied to the substrate W, and an RF signal is supplied from the RF power supply 31 to the electrically conductive member of the substrate support 11 and/or the electrically conductive member of the showerhead 13. The precursor layer is modified with a plasma formed from this second gas, thus forming the deposited film. A purge step may be included between the first gas supply and the second gas supply. In this deposited film, one atomic layer formed at a time may be atomic layer deposition (ALD).

Figure 8:
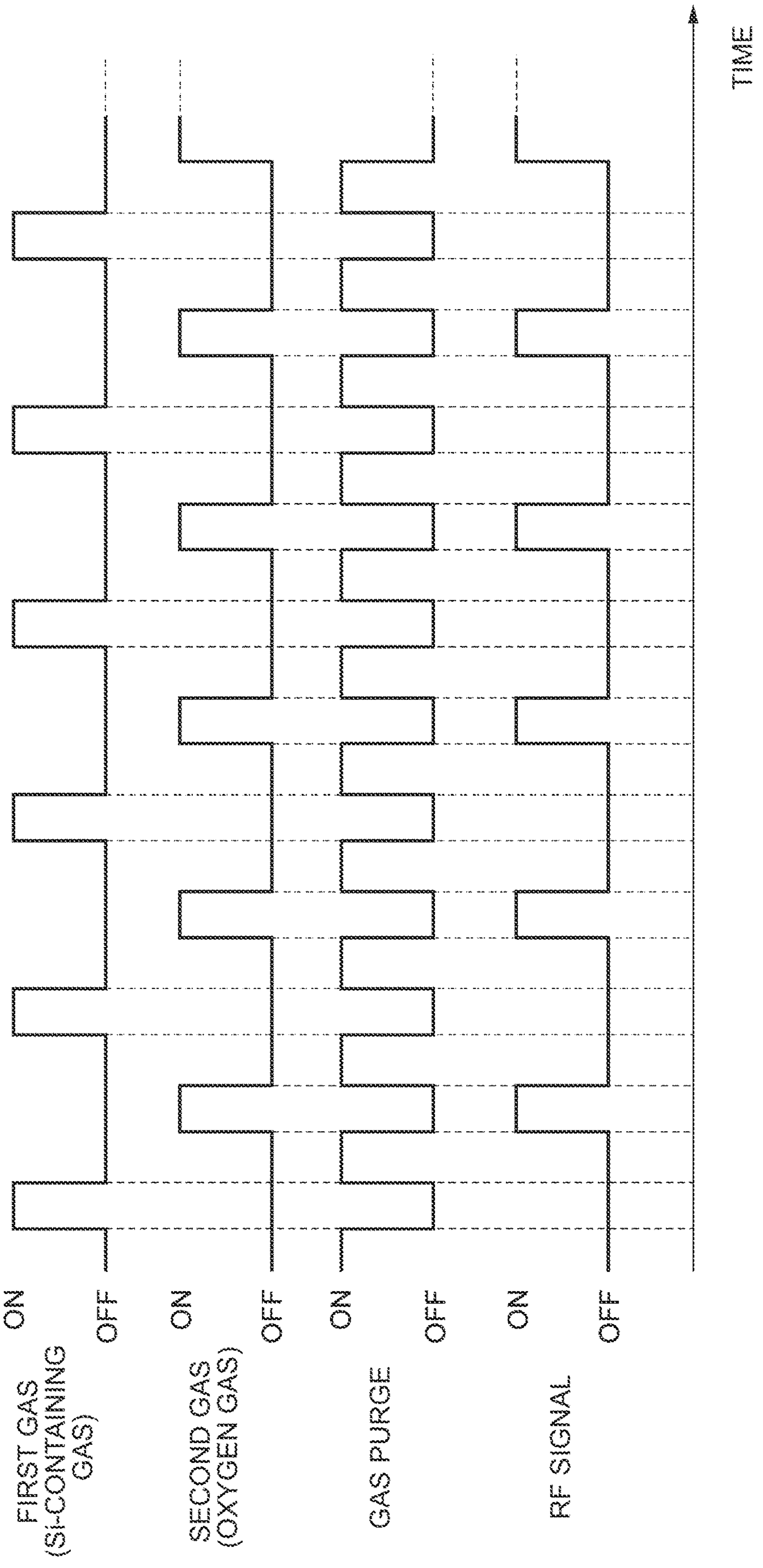
FIG. 8 is an example of a timing chart for ALD using a plasma.

FIG. 8 is an example of a timing chart for ALD using a plasma. According to FIG. 8, supply of the first gas (first gas "ON") and plasma formation derived from the second gas (second gas "ON" and RF signal "ON") are performed alternately. A gas purge (gas purge "ON") further may be performed between them. A subconformally deposited film also may be selectively formed on the tin-containing film 103. The subconformally deposited film means a deposited film having different thicknesses in the thickness direction of the substrate. For instance, the subconformally deposited film can be obtained by not adsorbing molecules of the first gas at the bottom and walls of the opening OP and/or by not modifying the precursor layer formed at the bottom and walls of the opening OP. Specifically, for example, the subconformal deposited film can be formed on the tin-containing film 103 by adjusting the supply time of the first gas or the plasma generation time derived from the second gas.

The deposited film may be formed by ALD that does not use plasma. For an example of ALD that does not use plasma, a method of forming an organic film through a polymerization reaction with a first organic compound and a second organic compound can be used. Examples of the first organic compound include isocyanates, carboxylic acids, carboxylic acid halides, and carboxylic anhydrides. Examples of the second organic compound include compounds with hydroxyl groups and amines.

Figure 9:
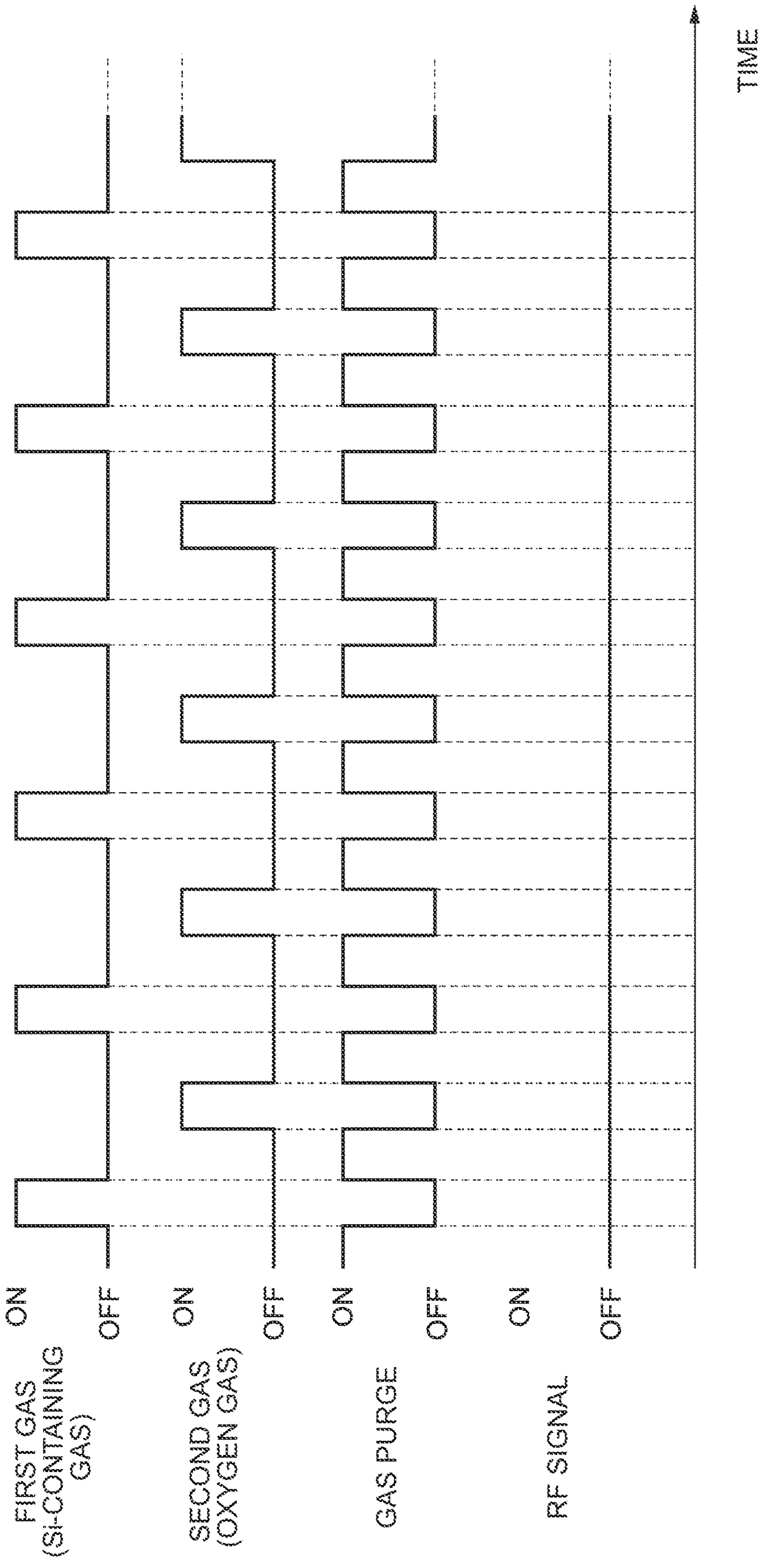
FIG. 9 is an example of a timing chart for ALD not using a plasma.

FIG. 9 is an example of a timing chart for ALD not using a plasma. According to FIG. 9, supply of a first organic compound (first gas "ON") and supply of a second organic compound (second gas "ON") are performed alternately. A gas purge (gas purge "ON") further may be performed between them. During this, no RF signal is supplied from the RF power supply 31 to the electrically conductive member of the substrate support 11 and/or the electrically conductive member of the showerhead 13 (RF signal "OFF"). A subconformally organic film also may be selectively formed on the tin-containing film 103. For instance, the subconformally organic film can be formed by not adsorbing molecules of the first organic compound at the bottom and walls of the opening OP and/or by not letting the second organic compound react with the molecules of the first organic compound adsorbed at the bottom and walls of the opening OP.

Figure 10:
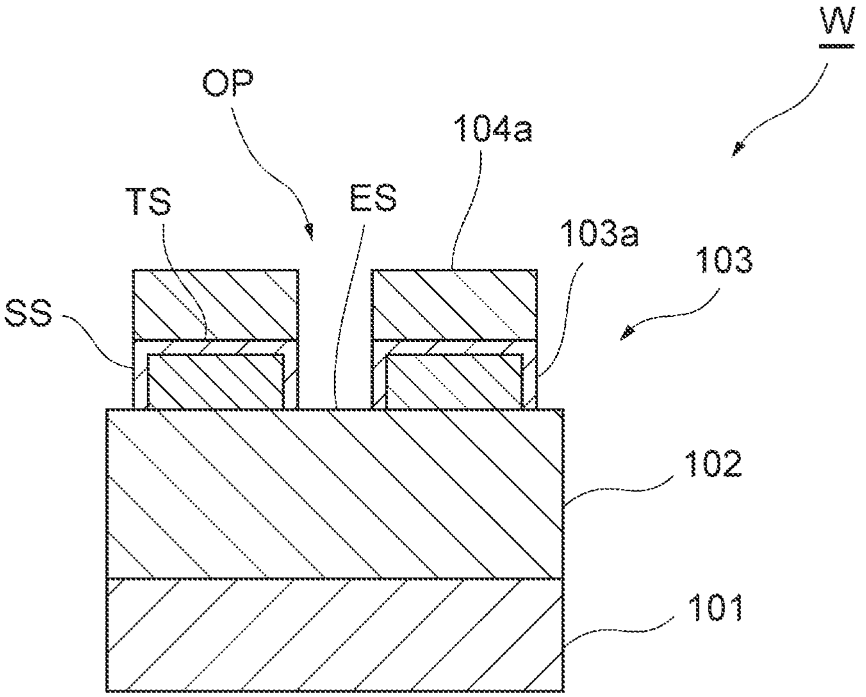
FIG. 10 illustrates an example of a selectively formed deposited film.

FIG. 10 illustrates an example of a selectively formed deposited film. As illustrated in FIG. 10, a deposited film 104*a* is selectively formed on the top surface TS of the tin-containing film 103. Selective formation may be performed, for example, by simultaneously supplying a gas that contributes to film formation, such as carbon gas, and a gas that contributes to etching, such as nitrogen gas, to the plasma processing space 10*s* plasma processing. This makes the deposition and etching amounts cancel each other on the side surfaces SS of the tin-containing film 103 and the exposed surface ES of the etching target film 102, while making the amount of deposition larger than the amount of etching on the top surface TS due to loading effects and other factors. As a result, no deposited film is formed on the side surfaces SS of the tin-containing film 103 and the exposed surface ES of the etching target film 102, and the deposited film 104*a* is formed only on the top surface TS of the tin-containing film 103.

The deposited film 104*a*, together with the tin-containing film 103, can function as an etching mask for the etching target film 102. That is, the thickness of the etching mask used in step ST3 (the dimension in the vertical direction in FIG. 10) can be increased by the thickness of the deposited film 104*a*. Appropriate selection of the material of the deposited film 104*a* can improve the etching resistance of this etching mask to the etching gas (processing gas) for the etching target film 102.

The deposited film may be formed from the same material as the material constituting the upper electrode included in the showerhead 13 of the substrate processing apparatus 1. The deposited film may be selectively formed on the top surface TS of the tin-containing film 103 on which the modified film 103*a* is formed, for example, by sputtering the upper electrode located above the substrate W.

Figure 11:
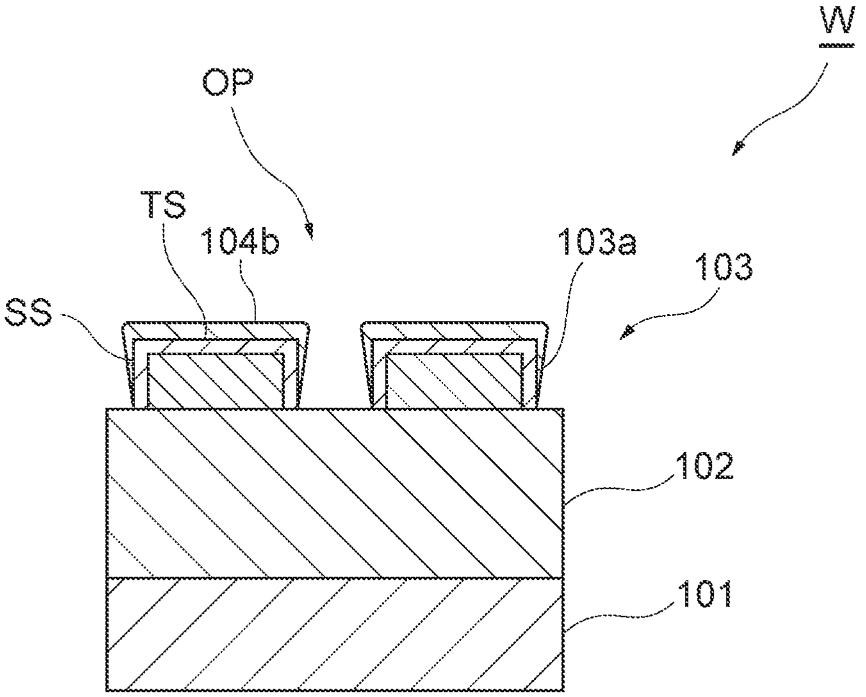
FIG. 11 illustrates an example of the deposited film formed by sputtering.

FIG. 11 illustrates an example of the deposited film formed by sputtering. As illustrated in FIG. 11, a deposited film 104*b* is selectively formed on the top surface TS of the surface of the tin-containing film 103 (to be thicker than on the side surfaces SS). For instance, sputtering of the upper electrode is performed by supplying processing gas containing a rare gas such as argon to the plasma processing space 10*s* to form a plasma, and applying a negative DC voltage to the showerhead 13 (upper electrode) of the substrate processing apparatus 1. The plasma argon ions collide with the showerhead 13, which has a negative potential. This sputters the constituent elements of the showerhead 13 (e.g., silicon), and the deposit containing these constituent elements falls on the surface of the substrate W to selectively form the deposited film 104*b* on the top surface TS of the tin-containing film 103.

The deposited film 104*b*, together with the tin-containing film 103, can function as an etching mask for the etching target film 102. That is, the thickness of the etching mask used in step ST3 (the dimension in the vertical direction in FIG. 9) can be increased by the thickness of the deposited film 104*b*. Appropriate selection of the material of the deposited film 104*b* (constituent elements of the showerhead 13) can improve the etching resistance of this etching mask to the etching gas (processing gas) for the etching target film 102.

In the examples illustrated in FIGS. 3 and 7, the modification process similar to step ST2 may be performed one or more times. For instance, during execution of step ST3 (etching process) in FIG. 3 and FIG. 7, the modification process may be executed at one or more timings (e.g., when the etching target film 102 is etched to a predetermined depth or when a portion of the film constituting the etching target film 102 is etched). This suppresses reduction of the modified film 103*a* of the tin-containing film 103 due to etching. For instance, in the example illustrated in FIG. 7, the modification process may be performed between step ST2*a* and step ST3. For instance, in the examples illustrated in FIGS. 3 and 7, the modification process in step ST2 and the etching process in step ST3 may be performed at the same time.

In the example illustrated in FIG. 7, the process of forming a deposited film similar to step ST2*a* (hereinafter referred to as "deposition process") may be performed one or more times. For example, during execution of step ST3 (etching process), the deposition process may be executed at one or more timings (e.g., when the etching target film 102 is etched to a predetermined depth or when a portion of the film constituting the etching target film 102 is etched). Multiple techniques may be combined for the deposition process. For instance, the formation of the deposited film 104*a* illustrated in FIG. 10 and the formation of the deposited film 104*b* illustrated in FIG. 11 may be alternately performed. The modification process and the deposition process may be repeated alternately.

The present processing method may be performed using the substrate processing system PS illustrated in FIG. 2, for example. In this case, each step in FIGS. 3 and 7 may be executed in the same substrate processing chamber of the substrate processing module PM (substrate processing chambers PM1 to PM6), or may be executed in different substrate processing chambers. The present processing method may be performed using another substrate processing apparatus including any plasma source, such as inductively coupled plasma or microwave plasma, other than the capacitively coupled substrate processing apparatus 1.

EXAMPLES

The following describes examples of this processing method. This disclosure is in no way limited by the following examples.

A substrate W was prepared in a substrate processing apparatus 1. The substrate W included a stack of a SOC film, a SOG film, and a tin-containing film with an opening pattern on silicon in this order. The opening pattern in the tin-containing film was a line-and-space (L/S) pattern. Next, modification process was performed on the tin-containing film using $Cl_2$/Ar (Example 1) and HBr/Ar (Example 2) as the processing gas.

FIG. 12 illustrates the results of the modification process of Examples. FIG. 12 indicates the measured thickness (nm), line CD (nm), space CD (nm), LWR (nm), and LER (nm) of the tin-containing films 103 before and after modification process (Example 1 and Example 2). In both Example 1 and Example 2, the roughness (LWR and LER) of the opening pattern of the tin-containing film improved by the modification process. In Example 1, the decrease in the thickness of the tin-containing film was suppressed compared to Example 2. If hydrogen is contained in the halogen-containing gas, the hydrogen is combined with tin in the tin-containing film during the modification process to form highly volatile tin hydride, which can reduce the film thickness of the tin-containing film 103. In Example 1, the halogen-containing gas does not contain hydrogen. Thus, it is considered that the decrease in film thickness due to the modification process of the tin-containing film 103 was suppressed more than in Example 2.

Exemplary embodiments of the present disclosure provide techniques of modifying a tin-containing film on a substrate.

Addendum 1

A substrate processing method comprising:

providing a substrate in a chamber, the substrate having an etching target film and a tin-containing film, the tin-containing film defining at least one opening on the etching target film; and forming a modified film by supplying a processing gas to the chamber to form the modified film on a surface of the tin-containing film, the processing gas including a halogen-containing gas or an oxygen-containing gas.

Addendum 2

The substrate processing method according to Addendum 1, wherein forming the modified film includes: forming a plasma from the processing gas; and forming the modified film on the tin-containing film by the plasma.

Addendum 3

The substrate processing method according to Addendum 2, wherein forming the modified film includes reacting the processing gas and a surface of the tin-containing film to form the modified film.

Addendum 4

The substrate processing method according to Addenda 1 to 3, wherein the modified film includes a tin-halogen bond.

Addendum 5

The substrate processing method according to Addenda 1 to 4, further comprising, after forming the modified film, forming a deposited film on the tin-containing film.

Addendum 6

The substrate processing method according to Addendum 5, wherein the deposited film is formed by at least one of plasma CVD and ALD.

Addendum 7

The substrate processing method according to Addendum 5, wherein the deposited film is selectively formed on a top surface of the tin-containing film.

Addendum 8

The substrate processing method according to Addendum 5, wherein the deposited film is formed by sputtering an upper electrode disposed above the substrate.

Addendum 9

The substrate processing method according to Addendum 5, wherein the sputtering includes: forming a plasma between the substrate and the upper electrode; and making the upper electrode have a negative potential.

Addendum 10

The substrate processing method according to Addenda 5 to 10, wherein forming the deposited film and forming the modified film are performed in the same chamber.

Addendum 11

The substrate processing method according to Addenda 1 to 10, further comprising etching the etching target film during or after formation of the modified film.

Addendum 12

The substrate processing method according to Addendum 11, wherein etching the etching target film and forming the deposited film are performed in the same chamber.

Addendum 13

The substrate processing method according to Addenda 1 to 12, wherein the tin-containing film includes photoresist.

Addendum 14

A substrate processing apparatus comprising:

a chamber; and a controller configured to cause (a) providing a substrate in the chamber, the substrate having an etching target film and a tin-containing film, the tin-containing film defining at least one opening on the etching target film; and (b) forming a modified film by supplying a processing gas to the chamber to form the modified film on a surface of the tin-containing film, the processing gas including a halogen-containing gas or an oxygen-containing gas.

Each of the above embodiments has been described for the purpose of description, and is not intended to limit the scope of the present disclosure. Each of the above embodiments may be modified in various ways without departing from the scope and gist of the present disclosure. For example, some components in one embodiment are able to be added to other embodiments. In addition, some components in one embodiment are able to be replaced with corresponding components in other embodiments.

KEY TO THE DRAWINGS

1 . . . Substrate processing apparatus, 10 . . . Plasma processing chamber, 10*s* . . . Plasma processing space, 11 . . . Substrate support, 13 . . . Showerhead, 20 . . . Gas supply, 21 . . . Gas source, 22 . . . Flow rate controller, 30 . . . Power supply, 31 . . . RF power supply, 32 . . . DC power supply, 40 . . . Exhaust system, 50 . . . Controller, 101 . . . Underlying film, 102 . . . Etching target film, 102*a* . . . First film, 102*b* . . . Second film, 102*c* . . . Third film, 103 . . . Tin-containing film, 103*a* . . . Modified film, 104 . . . Deposited film,

105 . . . Protective film, PS . . . Substrate processing system, W: Substrate, TS: Top surface, SS: Side surface, ES: Exposed surface, OP: Opening

What is claimed is:

1. A substrate processing method comprising:

providing a substrate in a chamber, the substrate having an etching target film and a tin-containing photoresist film, the tin-containing photoresist film defining at least one opening on the etching target film; and forming a modified film by supplying a processing gas to the chamber to form the modified film on a surface of the tin-containing photoresist film, the processing gas including a halogen-containing gas or an oxygen-containing gas, wherein forming the modified film includes reacting the processing gas and the surface of the tin-containing photoresist film to form the modified film.

2. The substrate processing method according to claim 1, wherein forming the modified film includes: forming a plasma from the processing gas; and forming the modified film on the tin-containing photoresist film by the plasma.

3. The substrate processing method according to claim 1, further comprising, after forming the modified film, forming a deposited film on the tin-containing film.

4. The substrate processing method according to claim 3, wherein the deposited film is formed by at least one of plasma CVD and ALD.

5. The substrate processing method according to claim 3, wherein the deposited film is selectively formed on a top surface of the tin-containing photoresist film.

6. The substrate processing method according to claim 3, wherein forming the deposited film and forming the modified film are performed in a same chamber.

7. The substrate processing method according to claim 3 further comprising etching the etching target film during or after formation of the modified film.

8. The substrate processing method according to claim 7, wherein etching the etching target film and forming the deposited film are performed in a same chamber.

9. A substrate processing method comprising:

providing a substrate in a chamber, the substrate having an etching target film and a tin-containing photoresist film, the tin-containing photoresist film defining at least one opening on the etching target film; and forming a modified film by supplying a processing gas to the chamber to form the modified film on a surface of the tin-containing photoresist film, the processing gas including a halogen-containing gas or an oxygen-containing gas, wherein the modified film includes a tin-halogen bond.

10. A substrate processing method comprising:

providing a substrate in a chamber, the substrate having an etching target film and a tin-containing film, the tin-containing film defining at least one opening on the etching target film;

forming a modified film by supplying a processing gas to the chamber to form the modified film on a surface of the tin-containing film, the processing gas including a halogen-containing gas or an oxygen-containing gas; and after forming the modified film, forming a deposited film on the tin-containing film, wherein the deposited film is formed by sputtering an upper electrode disposed above the substrate.

11. The substrate processing method according to claim 10, wherein the sputtering includes: forming a plasma between the substrate and the upper electrode; and making the upper electrode have a negative potential.

* * * * *